United States Patent
Chae et al.

(10) Patent No.: US 7,474,564 B2
(45) Date of Patent: Jan. 6, 2009

(54) NON-VOLATILE MEMORY DEVICE CAPABLE OF CHANGING INCREMENT OF PROGRAM VOLTAGE ACCORDING TO MODE OF OPERATION

(75) Inventors: Dong-Hyuk Chae, Seoul (KR); Dae-Seok Byeon, Gyeonggi-do (KR)

(73) Assignee: Samsung Electronics Co., Ltd., suwon-si, Gyeonggi-do (KR)

( * ) Notice: Subject to any disclaimer, the term of this patent is extended or adjusted under 35 U.S.C. 154(b) by 179 days.

(21) Appl. No.: 11/561,807

(22) Filed: Nov. 20, 2006

(65) Prior Publication Data
US 2007/0076488 A1   Apr. 5, 2007

Related U.S. Application Data

(63) Continuation of application No. 10/976,383, filed on Oct. 29, 2004, now Pat. No. 7,158,418.

(30) Foreign Application Priority Data
Jun. 7, 2004    (KR) ................. 2004-41438

(51) Int. Cl.
*G11C 11/34* (2006.01)
(52) U.S. Cl. ............... 365/185.19; 365/185.23; 365/189.09
(58) Field of Classification Search ........... 365/185.19, 365/185.23, 189.09
See application file for complete search history.

(56) References Cited

U.S. PATENT DOCUMENTS

| | | | |
|---|---|---|---|
| 5,485,422 A | 1/1996 | Bauer et al. | |
| 5,642,309 A | 6/1997 | Kim et al. | |
| 5,729,489 A | 3/1998 | Fazio et al. | |
| 6,111,789 A | 8/2000 | Choi et al. | |
| 6,295,228 B1 | 9/2001 | Pawletko et al. | |
| 6,442,071 B2 | 8/2002 | Choi | |
| 6,473,344 B2 | 10/2002 | Kim et al. | |
| 6,643,177 B1 | 11/2003 | Le et al. | |
| 6,845,060 B2 | 1/2005 | Lee | |
| 6,937,520 B2 | 8/2005 | Ono et al. | |

(Continued)

FOREIGN PATENT DOCUMENTS

JP     10-083687     3/1998

(Continued)

OTHER PUBLICATIONS

English language abstract of Korean Patent Application No. 2002-0039744.

(Continued)

*Primary Examiner*—Anh Phung
*Assistant Examiner*—Alexander Sofocleous
(74) *Attorney, Agent, or Firm*—Marger Johnson & McCollom, P.C.

(57) ABSTRACT

A non-volatile memory device includes a word line voltage generator circuit for generating a word line voltage to be supplied to a selected row in response to step control signals, and a program controller for generating the step control signals so that an increment of the word line voltage is varied according to the mode of operation, namely, a test mode or normal mode. Thus test time can be shortened.

10 Claims, 6 Drawing Sheets

U.S. PATENT DOCUMENTS

| | | | |
|---|---|---|---|
| 7,038,949 B2 * | 5/2006 | Chae et al. | 365/185.23 |
| 7,054,199 B2 | 5/2006 | Lee et al. | |
| 7,110,292 B2 * | 9/2006 | Hahn et al. | 365/185.03 |
| 7,345,923 B2 * | 3/2008 | Kim | 365/185.23 |

FOREIGN PATENT DOCUMENTS

| | | |
|---|---|---|
| JP | 11-110977 | 4/1999 |
| KR | 2002-0039744 | 5/2002 |

OTHER PUBLICATIONS

English language abstract of Japanese Publication No. 10-083687.
English language abstract of Japanese Publication No. 11-110977.
Ken Takeuchi, et al. "A Multipage Cell Architecture for High-Speed Programming Multilevel NAND Flash Memories", IEEE Journal of Solid-State Circuits, vol. 33, No. 8, Aug. 1998. pp. 1228-1238.

* cited by examiner

Fig. 1

(PRIOR ART)

NON-VOLATILE MEMORY DEVICE CAPABLE OF CHANGING INCREMENT OF PROGRAM VOLTAGE ACCORDING TO MODE OF OPERATION

CROSS-REFERENCE TO RELATED APPLICATIONS

This application is a Continuation of U.S. patent application Ser. No. 10/976,383, filed on Oct. 29, 2004, now pending, which is claims the priority of Korean Patent Application No. 2004-41438, filed Jun. 7, 2004, all of which are herein incorporated by reference in their entirety.

FIELD OF THE INVENTION

The present invention is a semiconductor memory device, and, in particular, a non-volatile memory device.

BACKGROUND OF THE INVENTION

In general, semiconductor memory devices are tested in a package and/or wafer level to judge whether defects exit therein. This is accomplished by storing data in memory cells and then reading the stored data from the memory cells. For example, test data is programmed into memory cells of a non-volatile memory device, and then a read operation is performed with a word line voltage varied. As a result of the read operation, this test is capable of measuring a threshold voltage distribution of memory cells. Defects of memory devices, such as a short circuit between cells, bit lines, or word lines, and the breaking of bit lines or word lines, can be judged by parsing the measured threshold voltage distribution. A program operation for this testing (hereinafter, referred to as a test program operation) is performed in the same manner as a normal program operation.

Figure 1:
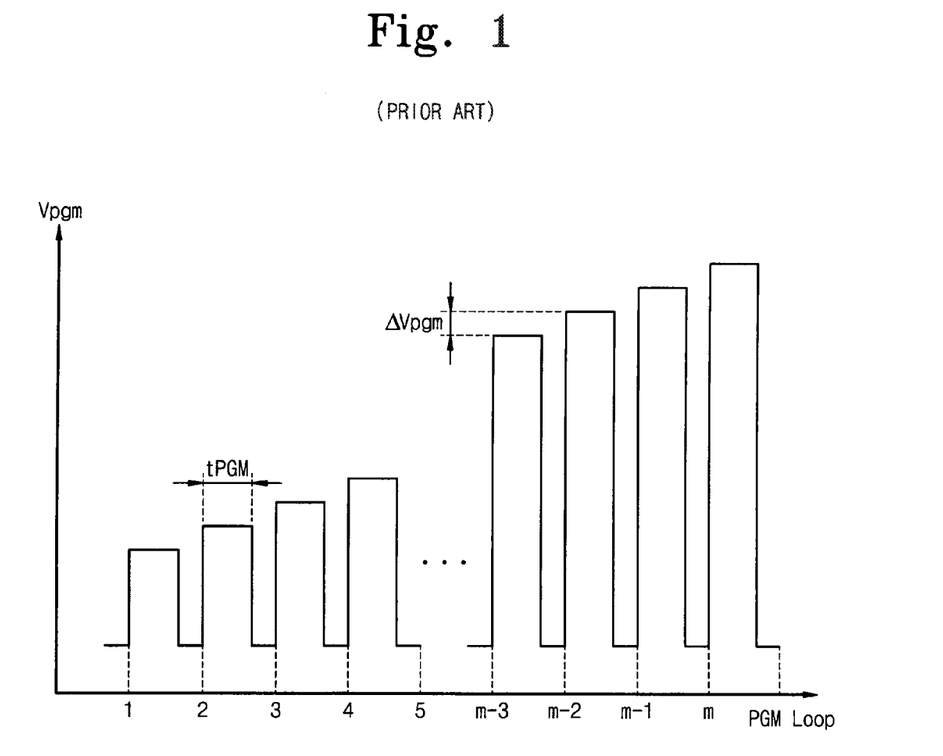
FIG. 1 is a diagram showing a word line voltage variation according to a conventional program method.

In common, an incremental step pulse programming (ISPP) scheme has been utilized to control the threshold voltage distribution precisely. With this ISPP scheme, as illustrated in FIG. 1, a program voltage Vpgm is stepwise increased as program loops of a program cycle are repeated. As is well known, each program loop includes a program period and a program verify period. The program voltage Vpgm is increased by a given increment $\Delta$Vpgm, and a program time tPGM is continuously maintained during each program loop. In accordance with the above ISPP scheme, a threshold voltage of a cell is increased by $\Delta$Vpgm during each program loop. For this, the increment of the program voltage has to be set small to obtain a narrow width of a threshold voltage distribution of finally programmed cells. As the increment of the program voltage decreases, the number of program loops of a program cycle increases. Accordingly, the program loop number may be determined to obtain an optimum threshold voltage distribution without limiting performance of a memory device.

Exemplary circuits for generating a program voltage according to the ISPP scheme are disclosed in U.S. Pat. No. 5,642,309 entitled "AUTO-PROGRAM CIRCUIT IN A NONVOLATILE SEMICONDUCTOR MEMORY DEVICE" and KP laid-open No. 2002-39744 entitled "FLASH MEMORY DEVICE CAPABLE OF PREVENTING PROGRAM DISTURB AND METHOD OF PROGRAMMING THE SAME".

For measuring the threshold voltage distribution of memory cells in order to judge whether defects exist, it is unnecessary to control the threshold voltage distribution tightly. This is because a test operation is carried out to confirm whether memory cells are normally programmed or whether programmed memory cells are incorrectly judged as erased memory cells, rather than judging whether memory cells exist in a desired threshold voltage distribution. Shortening the test time means increased productivity. Accordingly, for performing the test program operation in the same manner as the normal program operation, the time needed to program memory cells during the test program operation is identical to that during the normal program operation. Also, during the test program operation, the program voltage is generated in the same manner as that of the normal program operation. Thus it is difficult to shorten the time taken during the test program operation. However, it is possible to shorten this time required to program memory cells during the test program operation.

SUMMARY OF THE INVENTION

It is therefore an object of the invention to provide a non-volatile memory device capable of shortening the test time.

It is another object of the invention to provide a non-volatile memory device capable of varying the increment of the program voltage according to the modes of operation.

In accordance with one aspect of the present invention, a non-volatile memory device is provided which comprises an array of memory cells arranged in rows and columns, a word line voltage generator circuit for generating a word line voltage to be supplied to a selected row in response to step control signals, and a program controller for generating the step control signals so that an increment of the word line voltage is varied according to the mode of operation.

In this embodiment, an increment of the word line voltage during a test program mode of operation is larger than that during a normal program mode of operation.

In this embodiment, each of the memory cells comprises a multi-level memory cell for storing n-bit data. Alternatively, each of the memory cells comprises a single-level memory cell for storing 1-bit data.

In this embodiment, the program controller comprises a control logic for generating a count-up pulse signal according to whether each program loop of a program cycle is passed; and a step control signal generator circuit for generating the step control signals in response to the count-up pulse signal, and a mode select signal indicating the mode of operation.

In this embodiment, when the mode select signal indicates a normal program mode of operation, the step control signal generator circuit sequentially activates the step control signals in response to the count-up pulse signal.

In this embodiment, when the mode select signal indicates a test program mode of operation, the step control signal generator circuit sequentially activates a part of the step control signals in response to the count-up pulse signal.

In this embodiment, the increment of the word line voltage during the test program mode of operation becomes N-times larger than that during the normal program mode of operation.

In accordance with another aspect of the present invention, a non-volatile memory device is provided which comprises an array of memory cells arranged in rows and columns, a word line voltage generator circuit for generating a word line voltage to be supplied to a selected row in response to step control signals, a control logic for generating a count-up pulse signal according to whether each program loop of a program cycle is passed, and a step control signal generator circuit for generating the step control signals in response to the count-up pulse signal and a mode select signal. An increment of the word line voltage is varied according to whether the mode select signal is activated.

In this embodiment, the increment of the word line voltage is constant during each of the test and program modes of operation.

In this embodiment, when the mode select signal indicates a normal program mode of operation, the step control signal generator circuit sequentially activates the step control signals in response to the count-up pulse signal.

In this embodiment, when the mode select signal indicates a test program mode of operation, the step control signal generator circuit sequentially activates a part of the step control signals in response to the count-up pulse signal.

In this embodiment, the increment of the word line voltage during the test program mode of operation becomes N-times larger than that during the normal program mode of operation.

In this embodiment, the mode select signal is activated during a test program mode of operation and the word line voltage is stepwise increased whenever program loops of a program cycle are repeated.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

The preferred embodiment of the invention will be more fully described with reference to the attached drawings.

Figure 2:
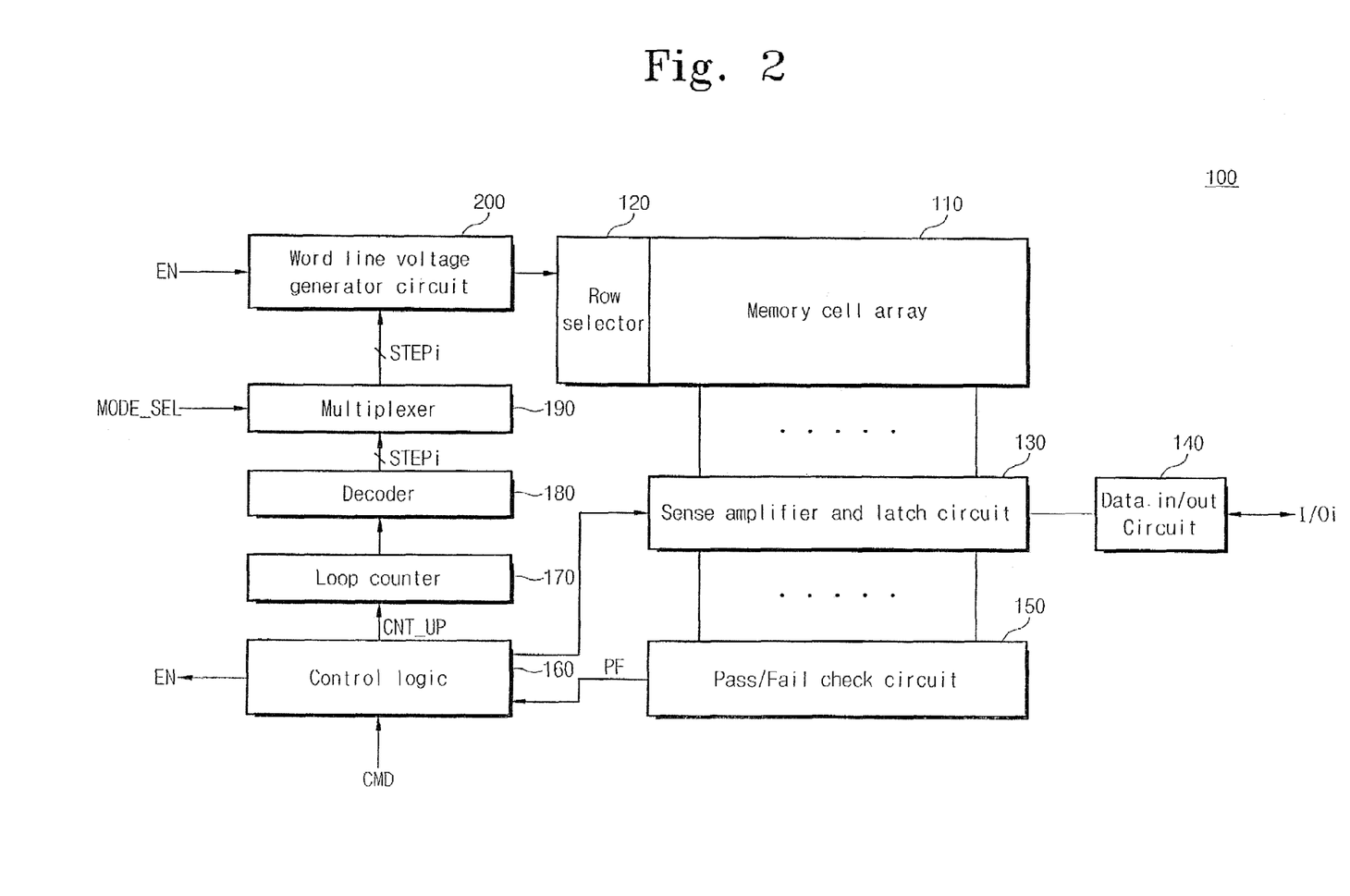
FIG. 2 is a schematic block diagram of a non-volatile memory device according to the present invention.

FIG. 2 schematically shows a non-volatile memory device according to the present invention. A non-volatile memory device 100 according to the present invention is a flash memory device. However, it is obvious to ones skilled in the art that the present invention can be applied to other memory devices (e.g., MROM, PROM, FRAM, etc.).

The non-volatile memory device 100 of the present invention includes a memory cell array 110 that has memory cells arranged in rows (or word lines) and columns (or bit lines). Each of the memory cells stores 1-bit data. Alternatively, each of the memory cells stores n-bit data (n is an integer greater than 1). A row selector circuit 120 selects at least one of the rows in response to a row address and drives the selected row with a word line voltage from a word line voltage generator circuit 200. A sense amplifier and latch circuit 130 is controlled by a control logic 160 and reads out data from the memory cell array 110 during a read/verify operation. Data read during the read operation is outputted to an external port via a data input/output circuit 140, while data read during the verify operation is outputted to a pass/fail check circuit 150. The sense amplifier and latch circuit 130 receives data to be written into the memory cell array 110 via the data input/output circuit 140 during a program operation, and drives respective bit lines with a program voltage (e.g., a ground voltage) or a program inhibit voltage (e.g., a power supply voltage) according to the received data.

The pass/fail check circuit 150 judges whether data values from the sense amplifier and latch circuit 130 at a program/erase verify operation have the same data (e.g., a pass data value), and outputs a pass/fail signal PF as the judgment result to the control logic 160. The control logic 160 activates the word line voltage generator circuit 200 in response to a command informing about a program cycle, and controls the sense amplifier and latch circuit 130 during each program loop of the program cycle. The control logic 160 activates a count-up signal CNT_UP in response to the pass/fail signal PF from the pass/fail check circuit 150. For example, when the pass/fail signal PF indicates that at least one of the data values from the sense amplifier and latch circuit 130 is a no-pass data value, the control logic 160 activates the count-up signal CNT_UP. That is, in the case that a program operation of a current program loop is not performed normally, the control logic 160 activates the count-up signal CNT_UP. On the other hand, in the case that a program operation of a current program loop is performed normally, the control logic 160 inactivates the count-up signal CNT_UP so that the program cycle is ended.

A loop counter 170 counts the program loop number in response to activation of the count-up signal CNT_UP. A decoder 180 decodes the output of the loop counter 170 to generate step control signals STEPi (i=0–n). For example, as the output value of the loop counter 170 is increased, the step control signals STEPi are activated sequentially. A multiplexer circuit 190 outputs step control signals STEPi to the word line voltage generator circuit 200 according to whether the mode select signal MODE_SEL is activated. For example, when the mode select signal MODE_SEL indicates a normal program operation, the step control signals STEPi are transferred to the word line voltage generator circuit 200 without modification. When the mode select signal MODE_SEL indicates a test program operation, the active order of the step control signals STEPi is changed and transferred to the word line voltage generator circuit 200. In the event that the mode select signal MODE_SEL is activated, although the step control signals STEPi from the decoder 180 are sequentially activated, the ones (e.g., STEP0, STEP3, STEP4, etc.) of the step control signals STEPi from the multiplexer circuit 190 are activated sequentially, which will be more fully described below.

The word line voltage generator circuit 200 is activated by an enable signal EN from the control logic 160 and generates the word line voltage in response to the step control signals STEPi transferred via the multiplexer circuit 190. The word line voltage generator circuit 200 stepwise increases the word line voltage as the step control signals STEPi are sequentially activated in the normal program operation. Likewise, the word line voltage generator circuit 200 stepwise increases the word line voltage as the ones of the step control signals STEPi are sequentially activated in the test program operation. That is, in the case of the present invention, the increment of the word line voltage during the test program operation is set differently from that during the normal program operation. For example, the increment of the word line voltage when the mode select signal MODE_SEL indicates the test program operation is larger than that when the mode select signal MODE_SEL indicates the normal program operation. The larger the increment of the word line voltage, the larger the variation of the threshold voltage. That is, as the increment of the word line voltage becomes larger, the time it takes to program a memory cell up to a target threshold voltage is shortened. As a result, the time for the test program operation becomes shorter than that for the normal program operation.

In this embodiment, the mode select signal MODE_SEL can be produced by the control logic 160, a bonding circuit, or a fuse circuit. For example, the control logic 160 can be configured to activate the mode select signal MODE_SEL in response to a test command. In the case of the bonding circuit, the mode select signal MODE_SEL of an active state can be provided from a tester. In the case of the fuse circuit, a fuse circuit can be configured so that the mode select signal MODE_SEL is inactivated after the test program operation. The mode select signal MODE_SEL is activated only during the test program operation although any one of the above-mentioned circuits is utilized.

In FIG. 2, the counter 170, the decoder 180 and the multiplexer circuit 190 constitute a step control signal generator circuit that generates the step control signals in response to the count-up signal and the mode select signal.

Figure 3:
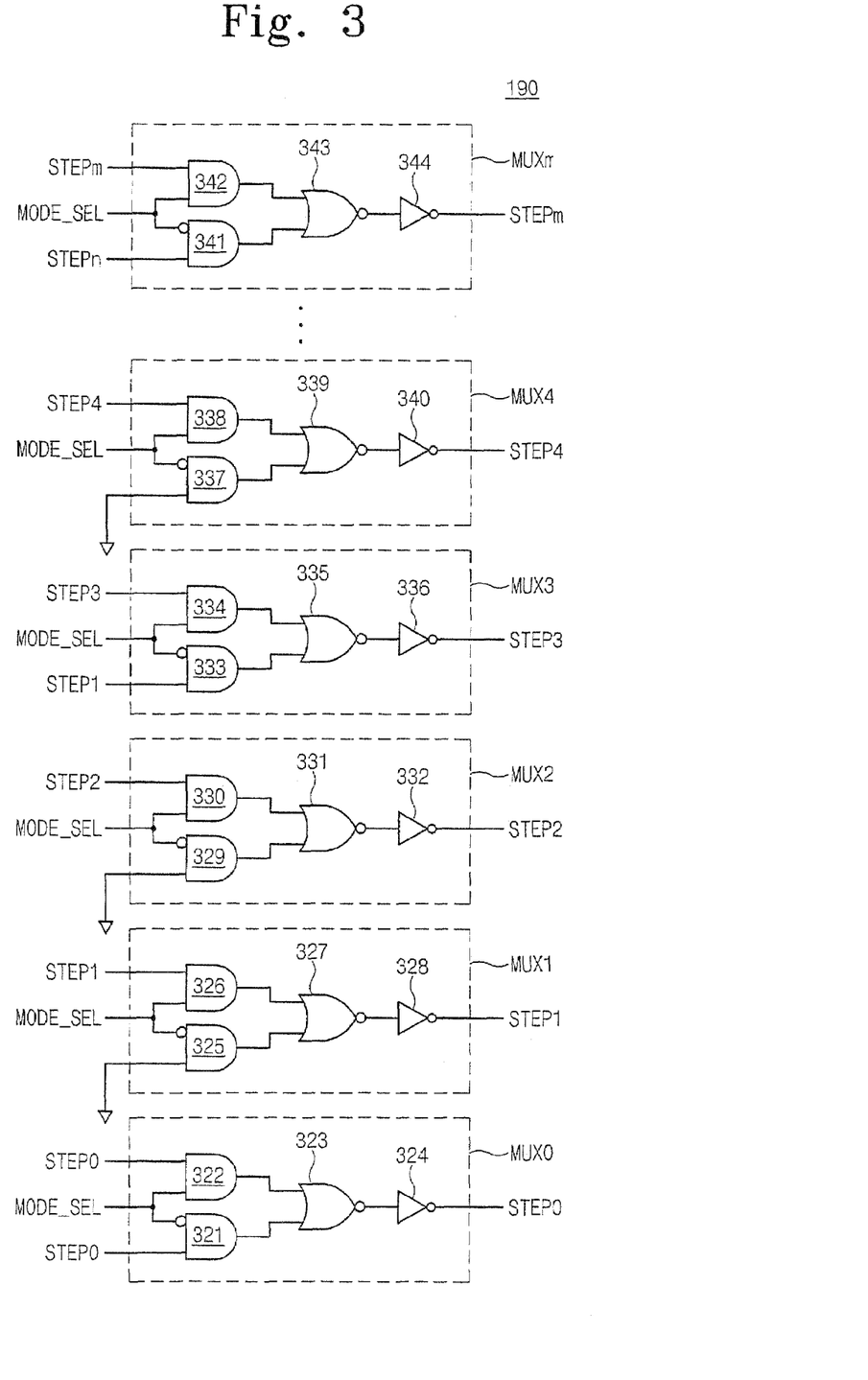
FIG. 3 is an exemplary circuit diagram of a multiplexer circuit illustrated in FIG. 2.

FIG. 3 is an exemplary circuit diagram of the multiplexer circuit in FIG. 2. Referring to FIG. 3, the present multiplexer circuit 190 includes a plurality of multiplexers MUX0-MUXm, each of which selects one of two input signals in response to a mode select signal MODE_SEL. Each multiplexer is comprised of two AND gates, a NOR gate and two inverters. In FIG. 3, elements marked by a circle indicate an inverter. The multiplexers MUX0-MUXm are supplied with corresponding step control signals STEP0-STEPm together with the mode select signal MODE_SEL. In this embodiment, the step control signals STEP0, STEP 1, ..., STEPn are applied to the multiplexers MUX0, MUX3, ..., MUXm as one input signal, respectively. As shown in FIG. 3, another input signal of each of the remaining multiplexers is set to a low level.

As program loops are repeated, a decoder 180 sequentially activates the step control signals STEPi irrespective of the mode of operation. If the mode select signal MODE_SEL has a high level indicating a normal program operation, the multiplexer circuit 190 sequentially activates the step control signals STEPi the same as the activation order of input signals. That is, a step control signal STEP0 is activated during activation of an input signal STEP0, a step control signal STEP 1 is activated during activation of an input signal STEP1, and a step control signal STEPm is activated during activation of an input signal STEPm. Remaining step control signals are also activated in the same order as above described. On the other hand, if the mode select signal MODE_SEL has a low level indicating a test program operation, the step control signal STEP0 is activated during activation of an input signal STEP0, a step control signal STEP3 is activated during activation of an input signal STEP1, and a step control signal STEPm is activated during activation of an input signal STEPn. That is, although input signals of the multiplexer circuit 190 are sequentially activated, the ones of the step control signals STEPi are sequentially activated.

Figure 4:
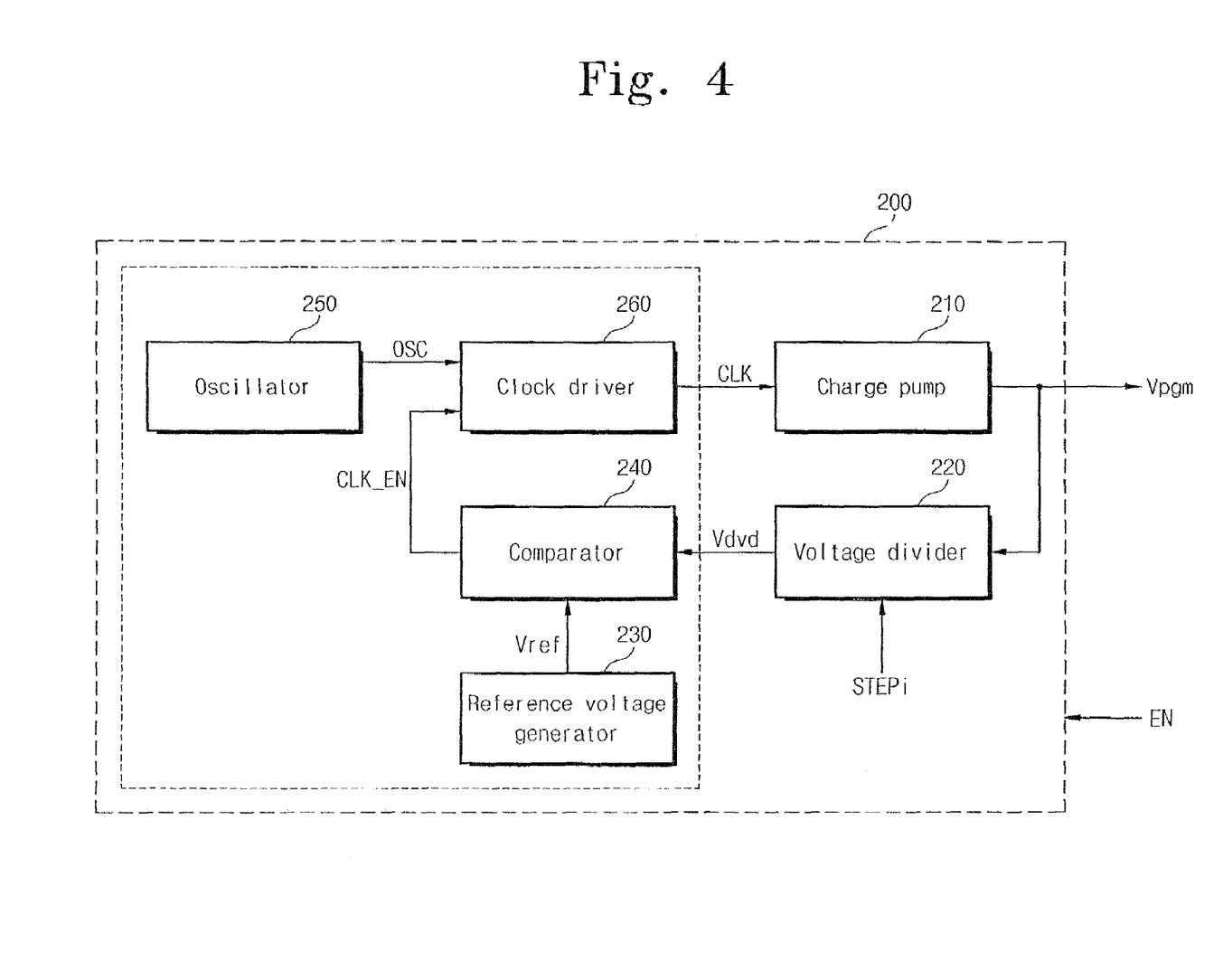
FIG. 4 is a schematic block diagram of a word line voltage generator circuit illustrated in FIG. 2.

FIG. 4 is a schematic block diagram of the word line voltage generator circuit illustrated in FIG. 2. Referring to FIG. 4, the word line voltage generator circuit 200 according to the present invention includes a charge pump 210, a voltage divider 220, a reference voltage generator 230, a compartor 240, an oscillator 250, and a clock driver 260, and is activated by an enable signal EN from the control logic 160 in FIG. 2.

The charge pump 210 generates the word line voltage Vpgm as a program voltage in response to a clock signal CLK. The voltage divider 220 divides and outputs the word line voltage Vpgm in response to step control signals STEPi. The comparator 240 compares a divided voltage Vdvd from the voltage divider 220 with a reference voltage Vref from the reference voltage generator 230 and generates a clock enable signal CLK_EN as the comparison result. For example, when the divided voltage Vdvd is lower than the reference voltage Vref, the comparator 240 activates the clock enable signal CLK_EN. The clock driver 260 outputs the clock driver CLK as an oscillation signal from the oscillator 250 in response to the clock enable signal CLK_EN. For example, when the clock enable signal CLK_EN is activated high, the oscillator signal OSC is outputted as the clock signal CLK. This means that the charge pump 210 operates. When the clock enable signal CLK EN is inactivated low, the oscillation signal OSC is blocked so that the clock signal CLK is not toggled. This means that charge pump 210 does not operate.

In this embodiment, the reference voltage generator circuit 230, the comparator 240, the oscillator 250, and the clock driver 260 constitute a circuit that controls the charge pump 210 according to the divided voltage of the voltage divider 220.

As is well known from the above description, if the word line voltage Vpgm is lower than a required voltage, the clock signal CLK is generated so the charge pump 210 operates. If the word line voltage Vpgm reaches the required voltage, no clock signal CLK is generated, so that the charge pump does not operate. The word line voltage will be generated by the above-mentioned stages.

Figure 5:
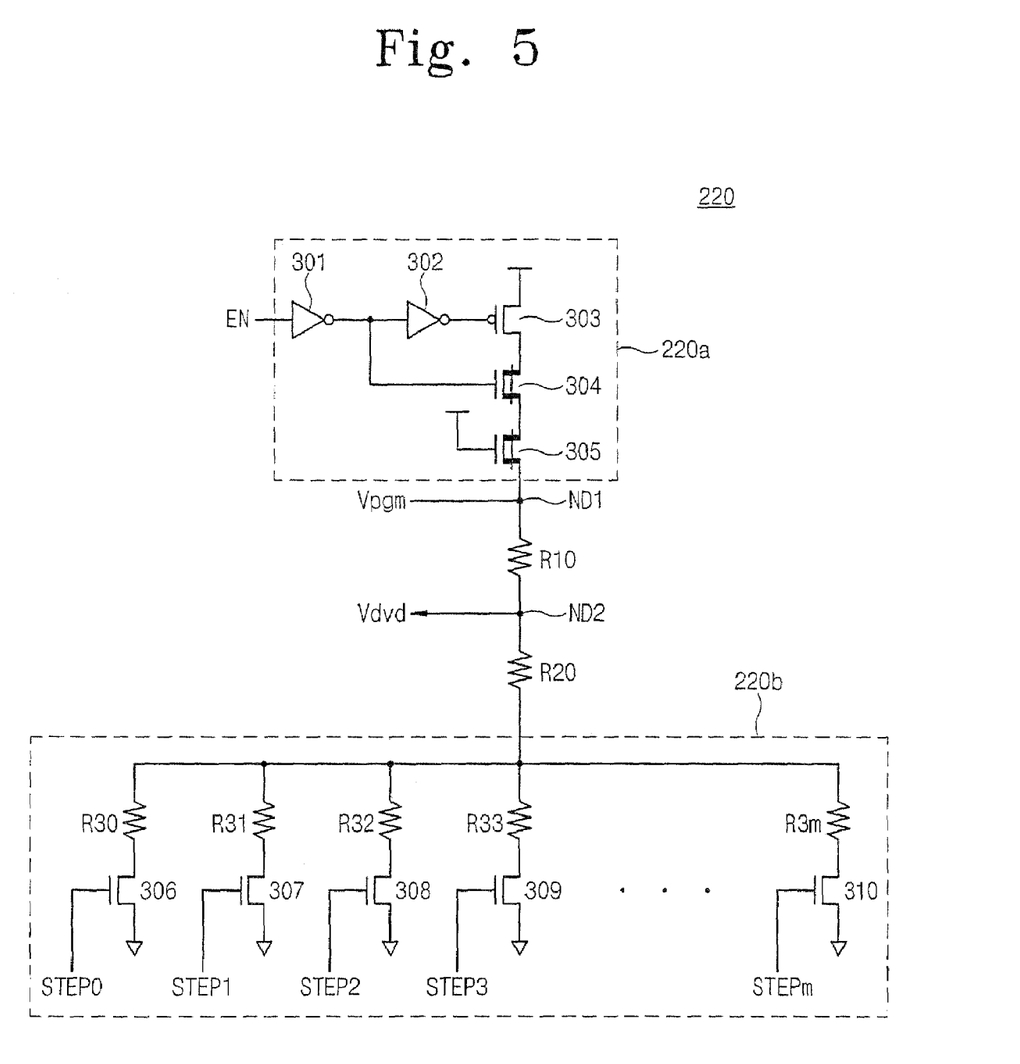
FIG. 5 is an exemplary circuit diagram of a voltage divider illustrated in FIG. 3.

FIG. 5 is an exemplary circuit diagram of the voltage divider illustrated in FIG. 4. Referring to FIG. 5, a voltage divider 220 includes a discharge part 220a, first and second resistors R10 and R20, and a variable resistance part 220b. The discharge part 220a is connected to an input terminal ND1 for receiving a word line voltage Vpgm, and sets a high voltage (e.g., the word line voltage) of the input terminal ND1 to a power supply voltage in response to an enable signal EN. The discharge part 220a comprises inverters 301 and 302, a PMOS transistor 303, and depletion-type NMOS transistors 304 and 305, which are connected as illustrated in FIG. 5. The depletion-type NMOS transistors 304 and 305 are well-known high-voltage transistors that are fabricated to endure a high voltage.

The first resistor R10 is connected between the input terminal ND1 and an output terminal ND2 for outputting a divided voltage Vdvd. The second resistor R20 is connected between the output terminal ND2 and the variable resistance part 220b. The variable resistance part 220b has a plurality of resistance values, which are serially selected according to sequential activation of step control signals STEPi. The variable resistance part 220b includes a plurality of resistors R30-R3m and a plurality of NMOS transistors 306-310, which are connected as illustrated in FIG. 5. The resistors R30-R3m correspond to NMOS transistors 306-310, respectively. The NMOS transistors 306-310 are controlled by corresponding step control signals STEPi, respectively. Only one of the step control signals is activated in any given program loop.

The divided voltage Vdvd is determined by resistance values of the resistors R10 and R20 and the variable resistance part 220b, and is expressed by $$Vdvd=Vpgm(R2/(R1+R2)). \qquad \text{[Equation 1]}$$

In equation 1, R1 indicates a resistance value of the resistor R10, and R2 indicates a sum of resistance values of the resistor R20 and the variable resistance part 220b. The divided voltage Vdvd determined by equation 1 is compared with a reference voltage Vref through a comparator 240. The word line voltage Vpgm is increased by a given increment according to the comparison result. The word line voltage Vpgm is expressed by the following equation obtained from the above stages.

$$Vpgm = Vref(1 + R1/R2) \quad \text{[Equation 2]}$$

As understood from equation 2, the increment of the word line voltage Vpgm is inversely proportional to the variation of the resistance value R2. The increment of the word line voltage Vpgm is increased in level as the resistance value R2 is descreased. That is, as the step control signals STEPi are sequentially activated, the resistance value R2 continues to decrease. This means that the word line voltage Vpgm is stepwise increased by the increment.

As described above, the activation order of the step control signals STEPi is changed according to whether the mode select signal MODE_SEL indicates a test program operation. For example, when the mode select signal MODE_SEL indicates a normal program operation, the step control signals from the decoder, STEP0, STEP1, STEP2, ..., STEPm are activated sequentially. When the mode select signal MODE_SEL indicates the test program operation, the ones (e.g., STEP0, STEP2, STEP4, ...) of the step control signals from the multiplexer circuit are activated sequentially. As a result, the increment of the word line voltage Vpgm at the test program operation is higher in level than that at the normal program operation.

Figure 6:
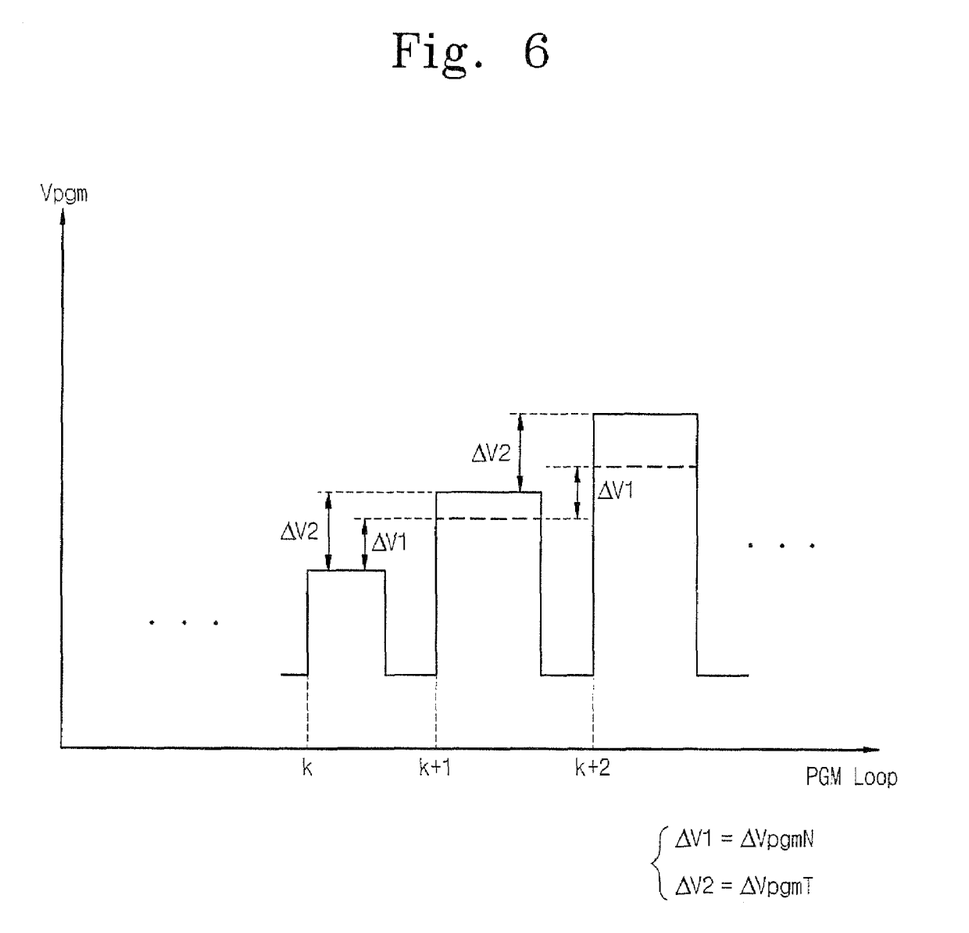
FIG. 6 is a diagram showing a word line voltage variation according to a program method of the present invention.

As illustrated in FIG. 6, when the mode select signal MODE_SEL indicates the test program operation, the increment ΔVpgmT of the word line voltage Vpgm during the test program operation is larger than ΔVpgmN of the normal program operation. As the increment of Vpgm is increased in level, memory cells are programmed more rapidly under the same program conditions. This means that the time required for the test program operation is shortened compared with the time required for the normal program operation.

An operation of a non-volatile memory device according to the present invention will be more fully described with reference to accompanying drawings. As is well known, in the case of a non-volatile memory device such as a NAND-type flash memory device, a program cycle consists of a plurality of program loops, each of which is comprised of a program period and a program verify period. Before a test program operation is carried out, data to be programmed is loaded onto a sense amplifier and latch circuit 130. Afterward, as a program command is provided to the non-volatile memory device, the test program operation will be carried out. A mode select signal MODE_SEL is set to a low level during the test program operation. The mode select signal MODE_SEL is an active low signal.

A control logic 160 activates an enable signal EN in response to an input of a program command, and a word line voltage generator circuit 200 starts to generate a word line voltage Vpgm in response to activation of the enable signal EN. Here, during a first program loop, a step control signal STEP0 is activated by means of a loop counter 170 and a decoder 180. When the mode select signal MODE_SEL indicates the test mode of operation, the multiplexer circuit 190 activates a step control signal STEP0. At this time, the program voltage Vpgm is determined by equation 2. Once the word line voltage Vpgm reaches a desired voltage level of the first program loop, memory cells will be programmed in the well-known manner.

If a program operation of the first program loop is ended, a program verify operation is performed. During the program verify operation, the sense amplifier and latch circuit 130 reads out data from the memory cell array 110 and outputs the read data to the pass/fail check circuit 150. The pass/fail check circuit 150 judges whether data values from the sense amplifier and latch circuit 130 have the same data, that is, pass data values. If at least one of the data values has a no-pass data value, the control logic 160 activates a count-up signal CNT_UP. The loop counter 170 performs a count-up operation in response to the count-up signal CNT_UP. The counted value indicates a next program loop. The counted value is decoded by the decoder 180, so that a step control signal STEP 1 is activated. Although the step control signal STEP1 is activated by the decoder 180 during the test program operation, the multiplexer circuit 190 activates a step control signal STEP3. Accordingly, the word line voltage Vpgm is increased by a given increment since a resistance value R2 of the voltage divider 220 is increased as compared to the normal program operation where a step control signal STEP1 is activated. The above-described test program operation is repeated until data values from the sense amplifier and latch circuit 130 all have the pass data value.

In other words, the increment of the word line voltage Vpgm becomes large by controlling the activation order of step control signals applied to the voltage divider 220 during the test program operation. As the increment of the word line voltage Vpgm becomes large during the test program operation, the time required to perform the test program operation is shortened.

In this embodiment, the mode select signal MODE_SEL is an active low signal. But, it is obvious that the mode select signal MODE_SEL can be realized as an active high signal. With the above description, the increment of the word line voltage is changed according to an operating mode, and its increment is constantly maintained during a selected mode of operation. However, it is obvious to one skilled in this art that the increment of the word line voltage can be changed even during each program loop of the selected mode of operation.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method of generating a word line voltage to be applied to a selected word line of a non-volatile semiconductor memory device, the method comprising:
   generating step control signals in response to a repetition of program loops and a mode select signal, an active order of the step control signals being varied by the mode select signal; and
   stepping the word line voltage in response to the step control signals.

2. The method of claim 1, wherein the step control signals are sequentially activated when the mode select signal indicates a normal program mode of operation, so as to increase the word line voltage by a first increment.

3. The method of claim 2, wherein partial ones of the step control signals are sequentially activated when the mode select signal indicates a test program mode of operation, so as to increase the word line voltage by a second increment higher than the first increment.

4. The method of claim 1, wherein the step of generating step control signals comprises:
   counting a repeated number of program loops;
   decoding the counted value;
   generating the step control signals in response to the decoded value; and
   determining the active order of the mode select signal in response to the mode select signal.

5. The method of claim 4, wherein the step control signals are sequentially activated when the mode select signal indicates a normal program mode of operation, and partial ones of the step control signals are sequentially activated when the mode select signal indicates a test program mode of operation,
   whereby an increment of the word line voltage during the test program mode of operation is higher in voltage level than an increment of the word line voltage during the normal program mode of operation.

6. A method of generating a word line voltage to be applied to a selected word line of a non-volatile semiconductor memory device, the method comprising:
   sequentially activating first step control signals in response to a repetition of program loops;
   changing an active order of the first step control signals according to a mode select signal to generate second step control signals; and
   stepping the word line voltage in response to the second step control signal.

7. The method of claim 6, wherein the second step control signals are activated in the same order as the first step control signals when the mode select signal indicates a normal program mode of operation, so as to increase the word line voltage by a first increment.

8. The method of claim 7, wherein partial ones of the second step control signals are sequentially activated when the mode select signal indicates a normal program mode of operation, so as to increase the word line voltage by a second increment higher than the first increment.

9. The method of claim 6, wherein partial ones of the second step control signals are sequentially activated when the mode select signal indicates a test program mode of operation, so as to increase the word line voltage by an increment being higher than that at a normal program mode of operation.

10. The method of claim 6, wherein the non-volatile semiconductor memory device stores either one of multi-level data and single-level data.

* * * * *